(12) United States Patent
Gilbert

(10) Patent No.: US 6,489,849 B1
(45) Date of Patent: Dec. 3, 2002

(54) INTERPOLATOR HAVING DUAL TRANSISTOR RANKS AND RATIOMETRIC CONTROL

(75) Inventor: Barrie Gilbert, Portland, OR (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/466,050

(22) Filed: Dec. 17, 1999

(51) Int. Cl.[7] .................................................. H03G 3/20

(52) U.S. Cl. ....................................... 330/284; 330/288

(58) Field of Search ................................ 330/254, 284, 330/288, 259; 327/359

(56) References Cited

U.S. PATENT DOCUMENTS

| | | | |
|---|---|---|---|
| 5,077,541 A | 12/1991 | Gilbert | ........................ 330/284 |
| 5,432,478 A | 7/1995 | Gilbert | ........................ 330/284 |
| 5,684,431 A | 11/1997 | Gilbert et al. | .............. 330/297 |
| 6,084,472 A | * 7/2000 | Gilbert | ........................ 330/254 |

FOREIGN PATENT DOCUMENTS

EP          0 317 758 A2    8/1989

* cited by examiner

Primary Examiner—Steven J. Mottola
(74) Attorney, Agent, or Firm—Marger Johnson & McCollom, PC

(57) ABSTRACT

An interpolator utilizes two ranks of transistors to generate a plurality of interpolator currents within the confines of a low power supply voltage. The first rank of transistors are underdriven, thereby generating a plurality of partially switched currents having shallow Gaussian-shaped functions. The partially switched currents are then spatially amplified by the second rank of transistors to reduce the overlap of the currents from adjacent transistors. The first rank of transistors are driven ratiometrically by the difference of two control currents, thereby eliminating errors caused by inaccurate resistors and current sources. A biasing op-amp senses the interpolator currents and servos the first rank of transistors, thereby regulating the interpolator currents to a value determined by a reference voltage which is temperature compensated. Thus, the biasing op-amp automatically compensates for temperature variations and manufacturing uncertainties in devices throughout the entire interpolator. A current generator utilizes a current mirror scheme and current replication techniques to cancel transistor alpha effects, thereby generating precise ratiometric drive currents from a low power supply voltage.

49 Claims, 7 Drawing Sheets

INTERPOLATOR HAVING DUAL TRANSISTOR RANKS AND RATIOMETRIC CONTROL

BACKGROUND OF THE INVENTION

1. Field of the Invention

The present invention relates generally to interpolators, and more particularly, to interpolators having two ranks of transistors and ratiometric control.

2. Description of the Related Art

A variable gain amplifier using a continuously interpolated attenuator includes an attenuator network, a series of transconductance (gm) stages, an interpolator, a main amplifier, and associated support circuitry. The attenuator receives an input signal and generates a series of progressively attenuated signals at a series of tap points. Each gm stage is coupled to one of the tap points to receive one of the attenuated signals. The outputs from the gm stages are connected together and taken to the main amplifier so that the overall output signal is the sum of the output signals from all of the gm stages. The interpolator steers a bias current to the gin stages in response to a control signal such that, when the highest gain is selected, the gm stage closest to the input end of the attenuator is active, and the remaining gm stages are effectively off. As the gain is reduced, the interpolator steers the bias current to gin stages further away from the input end of the attenuator, thereby selecting gm stages that receive progressively attenuated versions of the input signal.

Some examples of interpolators used in variable gain amplifiers having continuously interpolated attenuators are disclosed in U.S. Pat. Nos. 5,684,431 and 5,077,541, both having a common inventor with the present application. Another example of an interpolator is disclosed in U.S. Pat. No. 5,432,478 also having a common inventor with the present application. These patents are incorporated herein by reference.

SUMMARY

In one aspect of the present invention, two ranks of transistors are utilized to generate interpolator currents. An input signal is applied to the first rank of transistors which generate a set of partially switched currents which greatly overlap the currents generated by adjacent transistors. The second rank of transistors spatially amplifies the partially switched currents, thereby reducing the overlap of the currents from adjacent transistors.

DETAILED DESCRIPTION

The present invention provides several techniques for improving the operation of an interpolator. A first aspect of the present invention is the use of two ranks of transistors to generate the interpolator currents. The voltages applied to the first rank of transistors are of a small amplitude, and therefore, this section generates a set of currents which are partially switched. That is, they have shallow Gaussian-shaped functions which greatly overlap the currents generated by adjacent transistors. The partially switched currents are subsequently "spatially amplified" by the second rank of transistors. This process reduces the overlap of the currents from adjacent transistors. An advantage of using two ranks of transistors is that allows the use of a low power supply voltage for all sections of the complete interpolator.

Another key aspect of the present invention is the use of two control currents to drive the first rank of transistors ratiometrically. This improves the accuracy of the interpolator because the position of the centroid of the interpolator currents is determined only by the ratio of these two currents and is independent of the specific "scaling" (which may have errors caused by inaccurate resistors and current sources) in the first interpolator layer.

A further aspect of the present invention is the use of a biasing servo-loop to define the value of the final interpolator output currents. An error amplifier senses the total interpolator currents and biases the first rank of transistors, thereby regulating the interpolator currents to a precise value determined by a reference voltage. The reference voltage is typically made proportional to absolute temperature (PTAT) to stabilize the gm of the cells driven by the interpolator currents. The biasing servo-loop automatically compensates for temperature variations and manufacturing uncertainties in devices throughout the entire interpolator. For example, the biasing op-amp can compensate for low beta in current mirror transistors that might be coupled between the first and second ranks of transistors.

Yet another aspect of the present invention is a precision current generator which utilizes a high-accuracy current mirror scheme and current replication techniques to cancel transistor alpha and early voltage effects, thereby generating precise ratiometric drive currents from a low power supply voltage.

Figure 1:
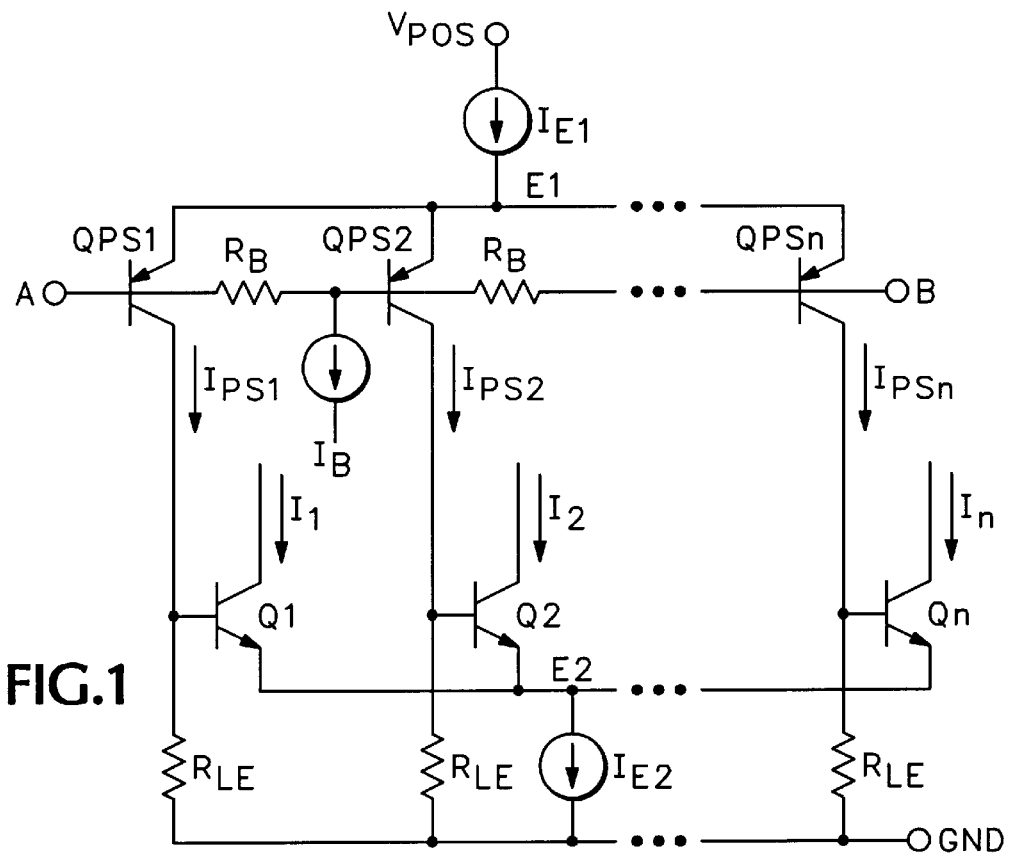
FIG. 1 is a schematic diagram of a first embodiment of an interpolator constructed in accordance with the present invention.

FIG. 1 is a schematic diagram of a first embodiment of an interpolator constructed in accordance with the present invention. The interpolator shown in FIG. 1 includes a first layer having a first rank of n transistors QPS1, QPS2, . . . QPSn, and a second layer having a second rank of n transistors Q1, Q2, ... Qn. The first layer includes a plurality (n−1) of base resistors $R_B$ connected between the bases of adjacent transistors, a plurality (n−2) of current sources connected to the bases of the first rank of transistors for providing currents $I_B$ thereto, and a current source $I_{E1}$ to emitter node E1 at which the emitters of the first rank of transistors are commonly connected. The invention can be implemented with different numbers (n) of transistors with different device polarities, and using CMOS rather than bipolar devices, as discussed below.

The first rank of transistors QPS1, QPS2, ... QPSn, generate a plurality of currents $I_{PS1}$, $I_{PS2}$, ... $I_{PSn}$, respectively, in response to a control voltage $V_{AB}$ applied differentially across terminals A and B. As this control voltage is swept from one end of its range to the other, the transistors in the first rank are partially switched on and then off in sequence starting at one end of the interpolator such that the current $I_{E1}$ is steered to different transistors in sequence. There is some overlap between adjacent transistors, and therefore, the current $I_{E1}$ is divided between the currents $I_{PS1}$, $I_{PS2}$, ... $I_{PSn}$ in varying amounts. This produces what can be described as a "centroid" that moves back and forth along the attenuator as the control voltage is varied up and down. That is, maximum conduction of $I_{E1}$ is moved from left to right, with a linear relationship to the voltage $V_{AB}$.

In prior art interpolators, $I_B R_B$ was moderately large, and the switching of $I_{E1}$, into the n transistors was fairly complete. This requires a rather large peak swing in the voltage $V_{AB}$, which cannot be accommodated within the constraints of a 2.7 volt supply voltage.

In the circuit of FIG. 1, however, rather than driving the first layer with enough voltage to fully switch the first rank of transistors on and off, the first rank of transistors are underdriven, thereby generating currents $I_{PS1}$, $I_{PS2}$, ... $I_{PSn}$ which are even more partially switched. That is, the Gaussian-shaped function of each of the currents $I_{PS1}$, $I_{PS2}$, ... $I_{PSn}$ (as a function of the control voltage) are very shallow and broad as compared to an interpolator in which the transistors are more fully switched. Thus, the first layer is referred to as a partially switched interpolator layer.

By underdriving the first rank of transistors, the total drive voltage required to move the centroid from one end of the interpolator to the other can be reduced. For example, whereas about 5 volts would typically be required to fully switch an eight-stage interpolator from one end to the other, a 12 stage interpolator can be partially switched according to the present invention with a total control voltage swing of only about 1.5 volts.

However, if the partially switched currents $I_{PS1}$, $I_{PS2}$, ... $I_{PSn}$ were used to drive the gm stages of a variable gain amplifier using a continuously interpolated attenuator, there would be no clear selection of one gm stage over another because the current pulses in the partially switched currents overlap too much.

Therefore, a second layer is included to "spatially amplify" the partially switched currents. The second layer includes a plurality of resistors $R_{LE}$ connected between the collectors of the first rank of transistors and a power supply common terminal GND to first convert the partially switched currents to voltages. The base of each of the second rank of transistors Q1, Q2, ... Qn is connected to a corresponding one of the collectors of the first rank of transistors. The emitters of the second rank of transistors are connected together at emitter node E2 which receives a current $I_{E2}$ from a second current source connected thereto. The final interpolator output currents $I_1$, $I_2$, ... $I_n$ are generated at the collectors of Q1, Q2, ... Qn, respectively.

Figure 2:
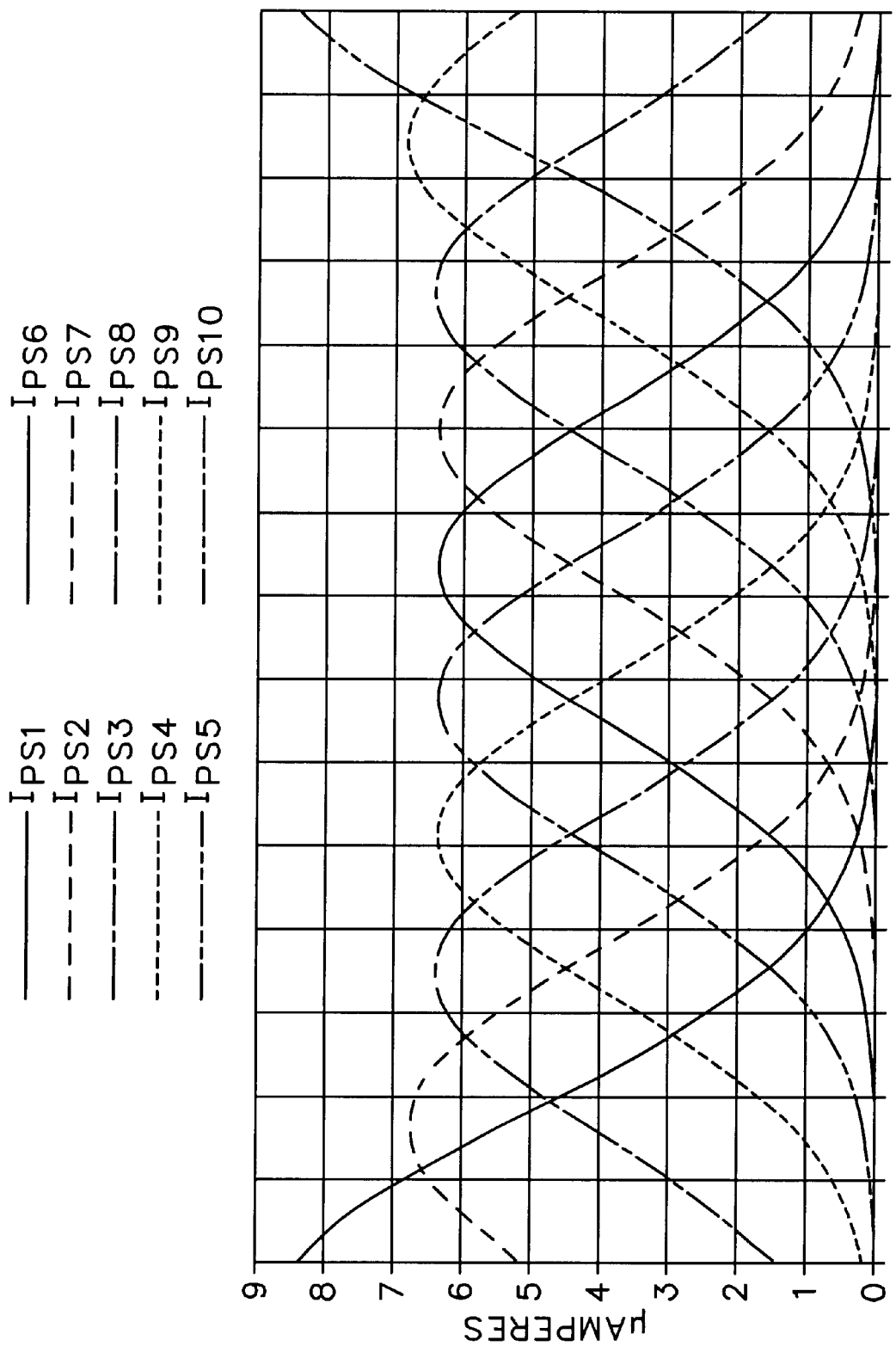
FIG. 2 is a graph showing the partially switched currents generated by an exemplary 10-transistor rank of partially switched transistors in accordance with the present invention.
Figure 3:
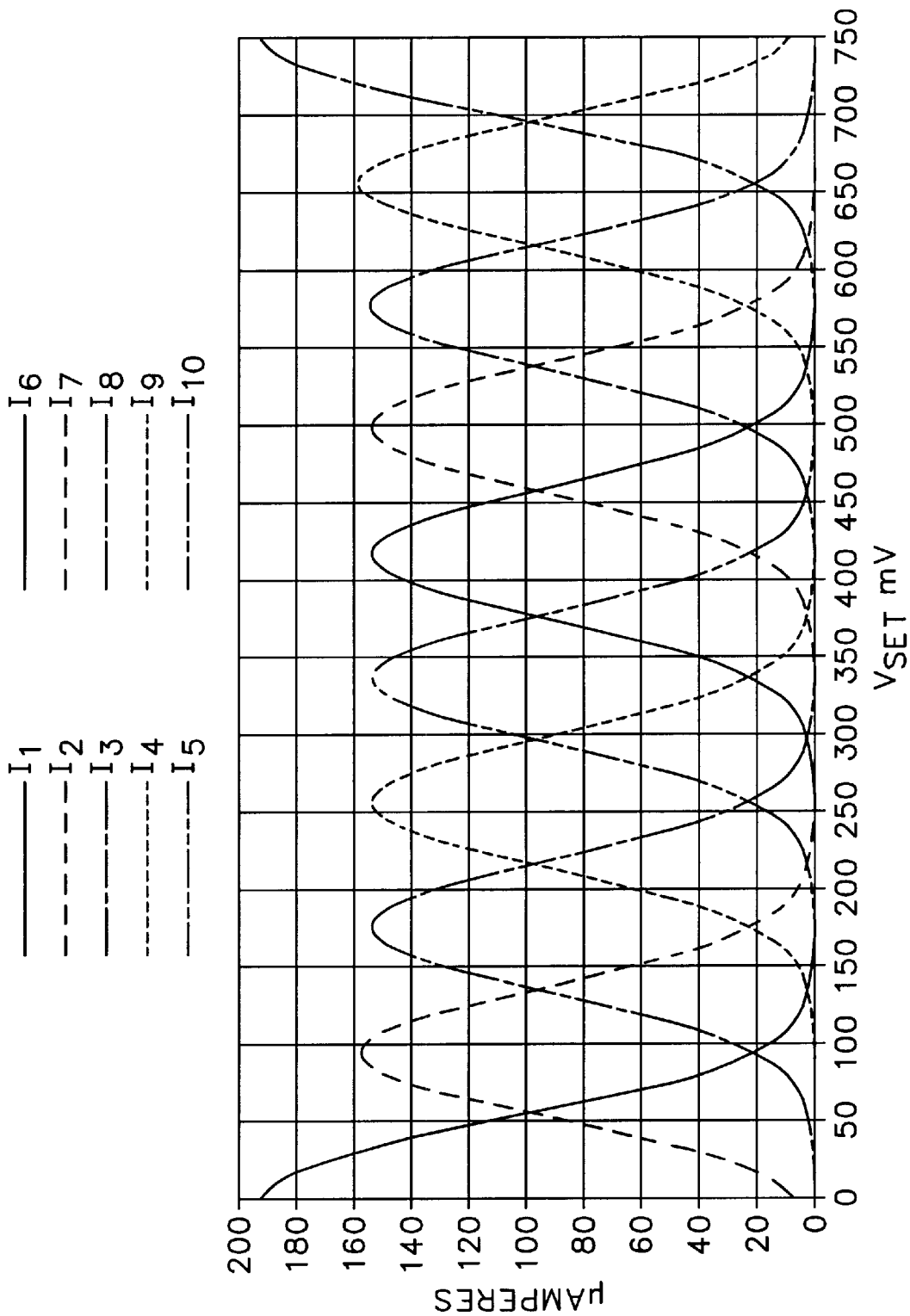
FIG. 3 is a graph showing final interpolator output currents corresponding to the partially switched currents shown in FIG. 2 and generated by a second rank of 10 transistors in accordance with the present invention.

The transconductance of the second rank of transistors operating on the voltage across the load resistors $R_{LE}$ causes a spatial amplification that reduces the current overlap between adjacent transistors. That is, the shapes of the interpolator currents $I_1$, $I_2$, ... $I_n$ are elongated and narrowed as compared to the partially switched currents $I_{PS1}$, $I_{PS2}$, ... $I_{PSn}$, taking on a narrower Gaussian form. This spatial amplification can be better understood with reference to FIG. 2, which shows the partially switched currents $I_{PS1}$, $I_{PS2}$, ... $I_{PSn}$, for a 10-stage rank of partially switched transistors, and FIG. 3, which shows the corresponding interpolator currents $I_1$, $I_2$, ... $I_n$. The currents shown in FIGS. 2 and 3 are shown as a function of a voltage set-point signal $V_{SET}$ which is related to the control voltage between terminals A and B as described below. As is apparent from FIGS. 2 and 3, a two-layer interpolator in accordance with the present invention generates interpolator currents having the required Gaussian shape and optimal overlap, but does so within the confines of a low power supply voltage.

Figure 4:
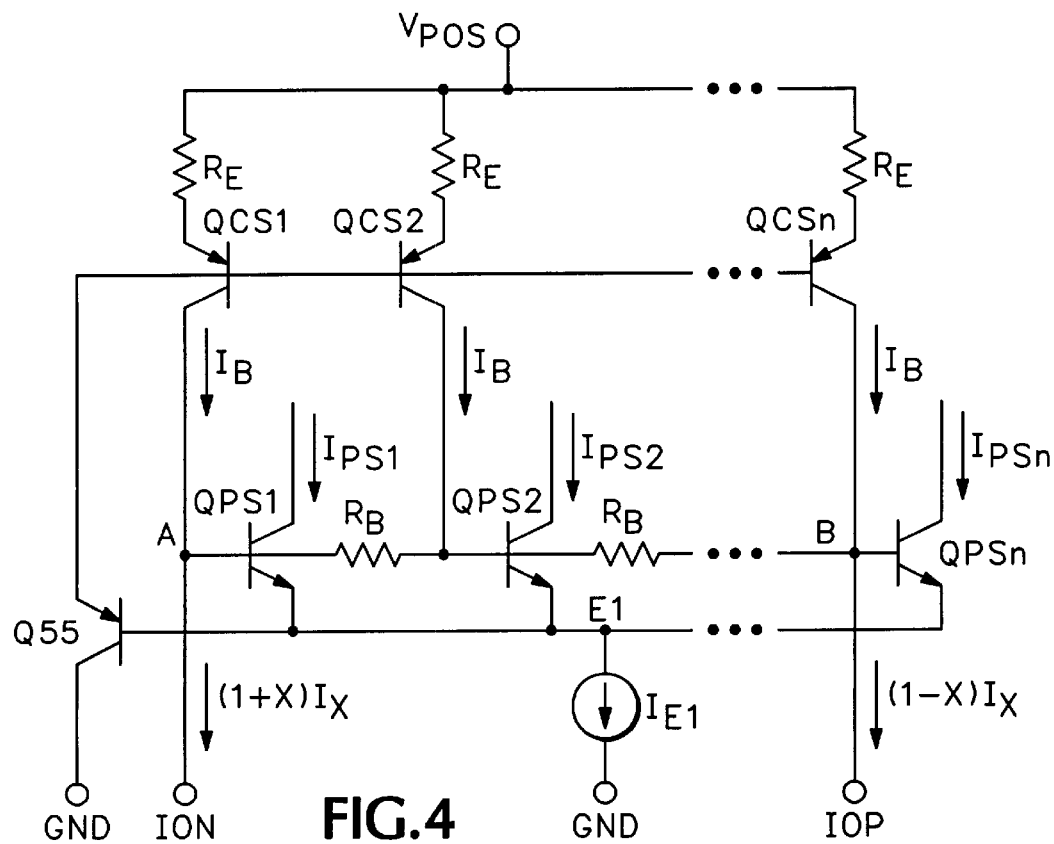
FIG. 4 is a schematic diagram showing more details of an embodiment of a partially switched interpolator layer constructed in accordance with the present invention.

FIG. 4 is a schematic diagram showing details of an embodiment of a partially switched interpolator layer constructed in accordance with the present invention now having a ratiometric response. The circuit of FIG. 4 is implemented with a first rank of NPN transistors QPS1, QPS2, ... QPSn having their emitters connected together at emitter node E1 for receiving the current $I_{E1}$. A plurality of n current sources are implemented as PNP transistors QCS1, QCS2, ... QCSn, each having its emitter connected to a positive power supply $V_{POS}$ through a resistor $R_E$, and its collector connected to the base of one of the transistors in the first rank. The bases of the current source transistors QCS1, QCS2, ... QCSn are connected together and to the emitter of a PNP transistor Q55. The collector of Q55 is grounded, and its base is connected to the emitter node E1.

An important feature of the circuit of FIG. 4 is that the input terminals A and B of the first rank of transistors are driven ratiometrically by currents $(1+X)I_X$ and $(1-X)I_X$, where X is a dimensionless modulation factor that varies between +1 and −1, and $I_X$ is a fixed current. In the absence of a ratiometric drive, the product of the base resistances $R_B$ and the currents $I_B$ determine the scaling sensitivity of the system to the voltage $V_{AB}$. Therefore, the accuracy depends on the absolute value of both $R_B$ and $I_B$. However, by using a current mode ratiometric technique, the system responds such that the centroid of the interpolator currents is determined only by the dimensionless factor X defining the complementary currents, and not by the absolute values of $I_B$, $R_B$ or even $I_X$. The absolute scaling can then be introduced in a current generator that generates the currents $(1+X)I_X$ and $(1-X)I_X$ as described below.

In operation, the currents $I_{E1}$, $(1+X)I_X$, and $(1-X)I_X$ pull the voltage at node E1 downward, causing transistor Q55 to drive the current source transistors QCS1, QCS2, ... QCSn into conduction until the currents $(1+X)I_X$ and $(1-X)I_X$ are completely absorbed by the n current source transistors. Since $(1+X)I_X+(1-X)I_X$ is simply $2I_X$, the currents $I_B$ each to a value of $2I_X/n$.

When the modulation factor X=0, and for the illustrative case where n is an odd number, the base of the transistor in the center of the first rank is at a higher voltage than all the remaining transistors, and therefore, the highest current flows through the center transistor. Thus, the centroid of action is located at the center of the interpolator, with smaller currents flowing in adjacent transistors. The value of $R_B$ determines how strong the partial switching process is. As $R_B$ increases, the more strongly the center transistor selects $I_{E1}$ over the other transistors. However, $R_B$ does not affect the position of the centroid. (If n is even, the bases of the two center transistors are at the same voltage, and the effective centroid is located between the two central transistors when X=0.)

At one extreme, when X=1, a current equal to $2 I_X$ flows entirely from terminal A, the base of QPSn is at the highest potential, and more of $I_{E1}$ flows through QPSn than any of the other transistors in the first rank, thereby moving the centroid all the way to the right-hand end of the interpolator. Again, the location of the centroid does not depend on the value of $I_B$, $R_B$, or $I_X$, only on the value of the modulation factor X. Likewise, when X=1, the centroid moves to the left-hand end of the network. The position of the centroid is a linear function of the modulation factor X.

Figure 5:
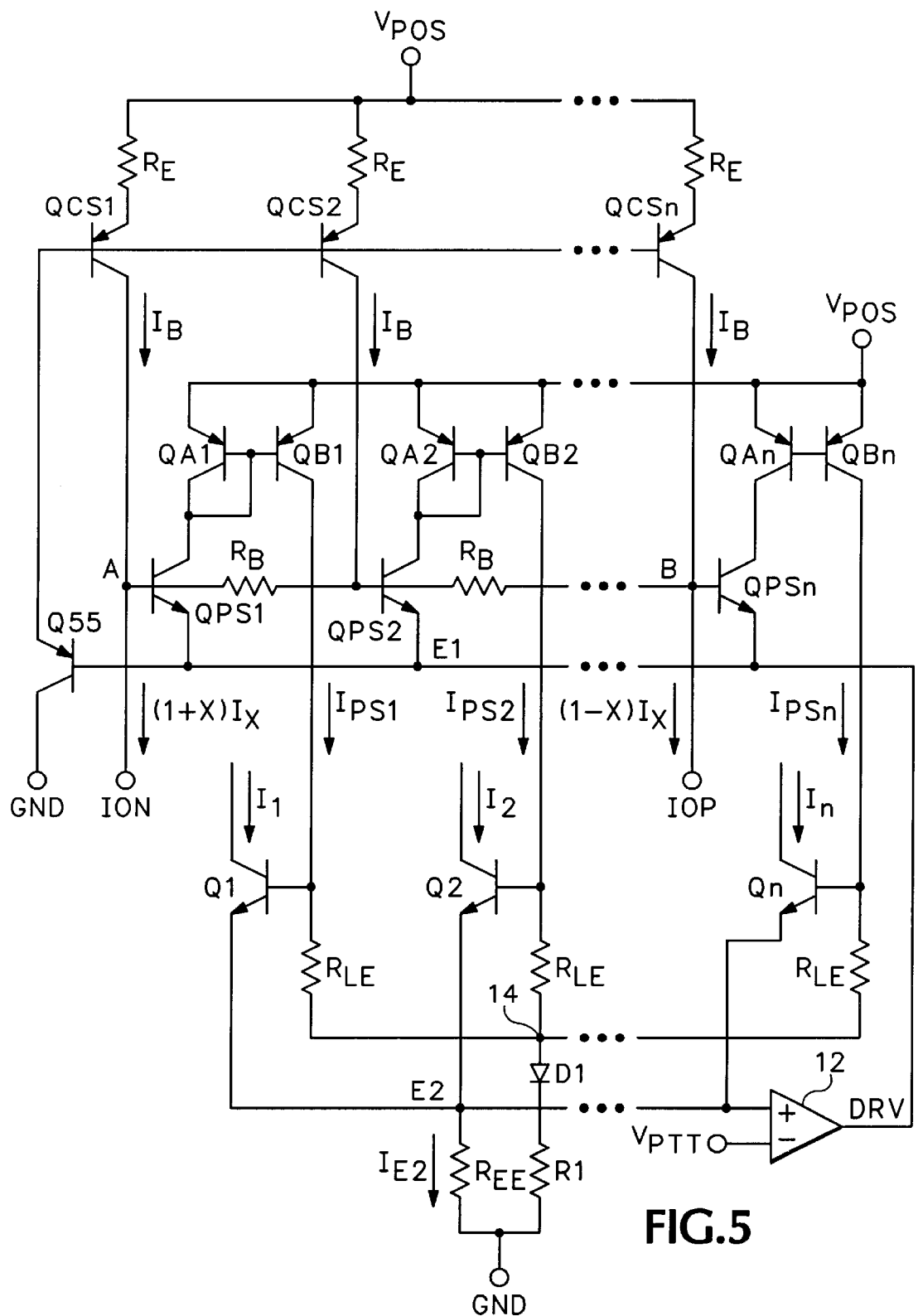
FIG. 5 is a simplified schematic diagram of a practical embodiment of an interpolator constructed in accordance with the present invention.

FIG. 5 is a simplified schematic diagram of a practical embodiment of an interpolator constructed in accordance with the present invention. The circuit of FIG. 5 is adapted for fabrication using a process that provides high quality NPN transistors, but lesser quality PNP transistors. Therefore, both the first and second ranks of transistors are fabricated with NPN transistors and are coupled together through PNP current mirrors of relatively poor accuracy.

The circuit of FIG. 5 includes a first layer which is in most respects the same as that shown in FIG. 4, but emitter node E1, rather than being connected to a current source $I_{E1}$, is connected to the output terminal of a biasing amplifier 12 to receive a drive signal DRV that sets the current through node E1 as described below.

The circuit of FIG. 5 also includes a second layer much like that shown in FIG. 1, but emitter node E2 is connected to GND through a resistor $R_{EE}$. Resistors $R_{LE}$ are connected to a node 14 which is connected to GND through a resistor R1 and diode D1. The partially switched currents $I_{PS1}$, $I_{PS2}$, ... $I_{PSn}$, are coupled to the bases of the second rank of transistors through currents mirrors formed by transistor pairs QA1/QB1, QA2/QB2, ... QAn/QBn. An emitter follower transistor can optionally be connected in series between each of the current mirrors and the base of the corresponding transistor in the second rank to prevent the shape of the interpolator currents from depending on the betas of the NPN transistors in the second rank.

The noninverting input terminal of biasing op-amp 12, which is principally a transconductance amplifier, is connected to node E2 to sense the current $I_{E2}$ which is the sum of the final interpolator currents $I_1$, $I_2$, ... $I_n$. The inverting input terminal of amplifier 12 receives a reference voltage $V_{PTT}$. This voltage is usually PTAT and determines the transconductance of the gm cells used in the interpolating amplifier section. Amplifier 12 drives the emitter node E1 of the first layer, so as to regulate the value of the current $I_{E2}$ to a precise value $V_{PTT}/R_{EE}$. Thus, a well-defined value is established for the interpolator currents regardless of device tolerances. Another advantage of using a biasing servo scheme as shown in FIG. 5 is that it automatically compensates for the finite beta in the PNP current mirror transistors.

If the ratiometric drive currents $(1+X)I_X$ and $(1-X)I_X$ are stable over temperature, the strength of the partial switching action of the first layer will change over temperature.

If the interpolator of FIG. 5 is to be used to drive the gm stages of a variable gain amplifier using a continuously interpolated attenuator, the reference voltage $V_{PTT}$ can be adjusted to compensate for two additional effects in the gm stages. First, a correction can be added to $V_{PTT}$ to compensated for the ohmic resistances of the differential transistors in the gin stages. This can be accomplished by generating $V_{PTT}$ with a reference cell that includes transistors that have the same ohmic resistance imperfections as those used in the gm stages. Second, $V_{PTT}$ can be corrected to compensate for the finite beta of the second rank of transistors, and also for the alpha between the emitter nodes and collectors of the differential transistors in the gm stages.

Figure 6:
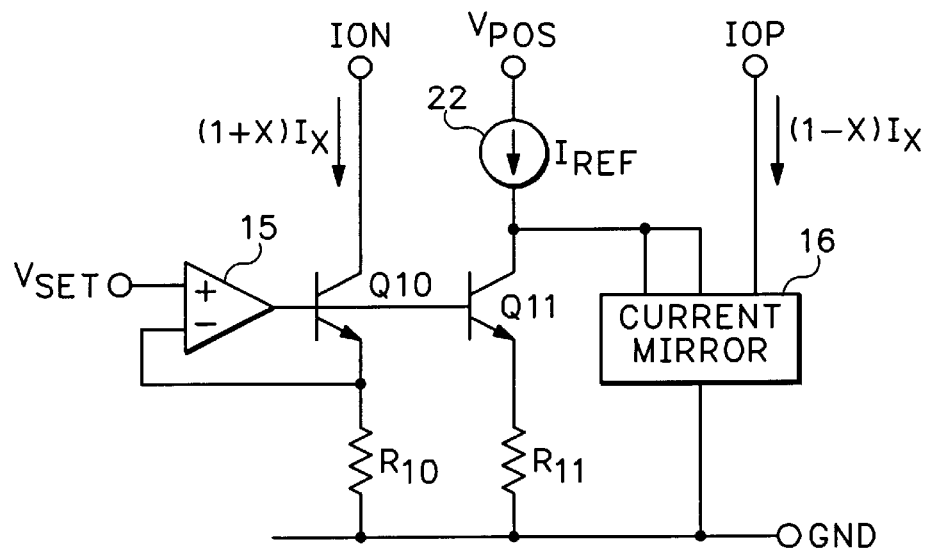
FIG. 6 is a simplified schematic diagram of an embodiment of precision ratiometric current generator constructed in accordance with the present invention.

FIG. 6 is a schematic diagram of a first embodiment of a precision current generator for generating the ratiometric currents $(1+X)I_X$ and $(1-X)I_X$ in accordance with the present invention. The circuit of FIG. 6 includes a transistor Q10 which has its emitter connected to GND through a resistor R10. An op-amp 15 receives the set-point signal $V_{SET}$ at its noninverting input. The inverting input of op-amp 15 is connected to the emitter of Q10, and its output is connected to the base of Q10 so that the voltage input at $V_{SET}$ is replicated across R10, thereby generating a corresponding current in the emitter of Q10. This current is then reduced by the alpha of Q10 and becomes the first output current $(1+X)I_X$ at the collector of Q10.

A transistor Q1 and resistor R11 are connected in parallel with Q10 and R10 to replicate the first output current. This replication current from the collector of Q11 is summed with a reference current $1_{REF}$ generated by current source 22. The collector of Q11 is also connected to the input terminal of a high gain current mirror 16. The second output current $(1-X)I_X$ is output from the current mirror.

When the input $V_{SET}$ is zero, Q10 and Q11 are off, and all of $I_{REF}$ is provided as the output current to terminal IOP through the current mirror. As $V_{SET}$ increases, the current through Q10 also increases and is provided to the first output terminal IOP, while the current through Q11 diverts an increasing amount of $I_{REF}$ from the current mirror, thereby reducing the second output current to IOP.

Because the outputs are ratiometric, the alpha of Q10 is inconsequential as long as it is replicated in the opposite leg through Q11, which has the same alpha. However, the current mirror 16 must have a very high gain (i.e., must be beta-immune) to avoid introducing an additional error into the second output current. The reference current $I_{REF}$ should also be corrected for the alpha of Q11.

Thus, the circuit shown in FIG. 6 provides an accurate pair of ratiometric currents, and it requires less power supply voltage than a fully differential structure would require.

Figure 7:
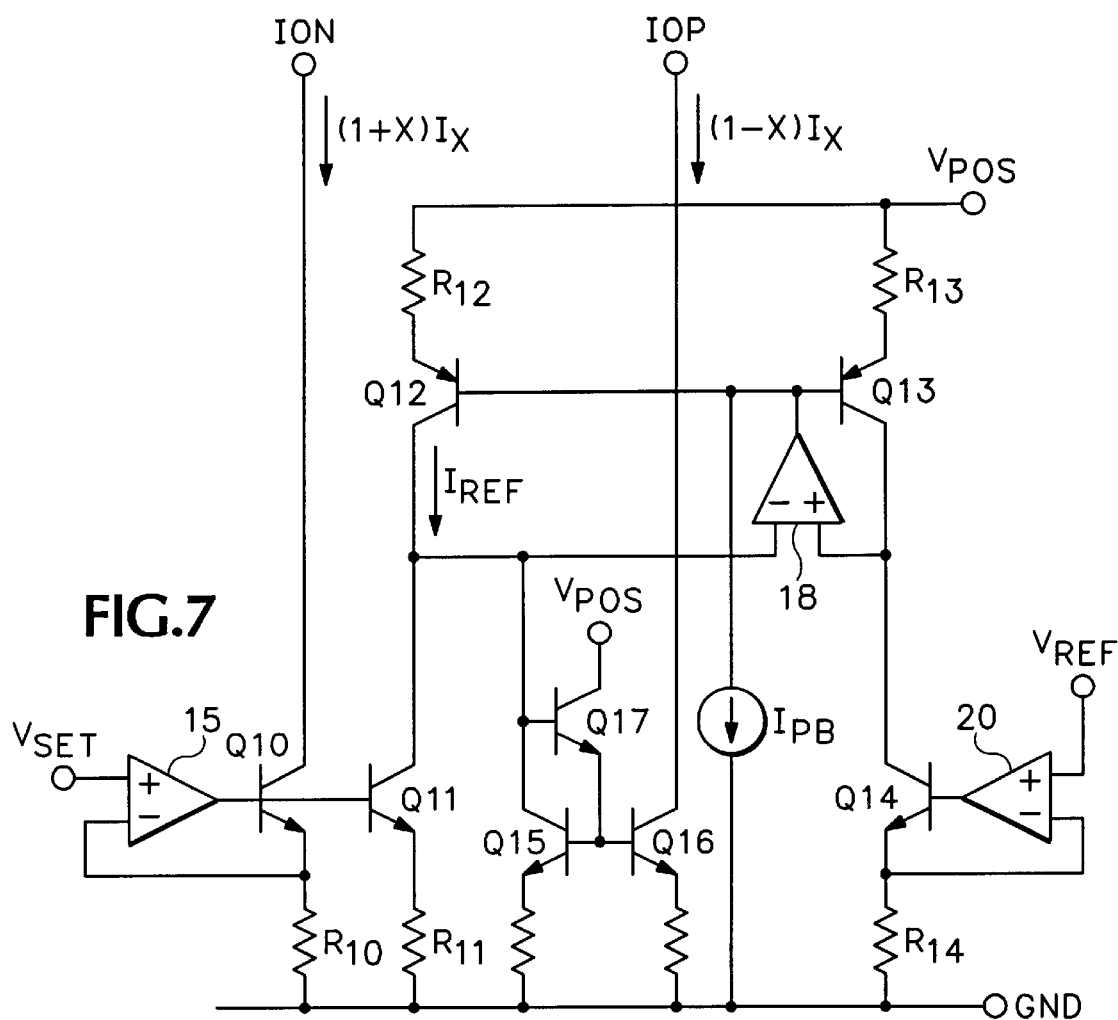
FIG. 7 is a schematic diagram showing more details of the circuit of FIG. 6 and illustrating a technique for generating a reference current in accordance with the present invention.

FIG. 7 is a schematic diagram showing a more detailed embodiment of the circuit of FIG. 6 and illustrating a technique for generating the reference current $I_{REF}$ in accordance with the present invention. The current mirror 16 is implemented with transistors Q15, Q16 and Q17. The reference current $I_{REF}$ is generated by a current mirror which includes transistors Q12 and Q13, and degeneration resistors R12 and R13. A pre-bias current source is connected to the bases of Q12 and Q13 to provide IPB which is most of the base current required by Q12 and Q13. The remaining base current is provided by an op-amp 18 which has its inputs connected to the collectors of Q12 and Q13 so as to cancel the effects of the input currents to the op-amp. Thus, the currents through Q12 and Q13 are precisely balanced.

A reference current, which is input to the current mirror formed by Q12 and Q13, is provided by a transistor Q14 which has its emitter connected to GND through R14. Resistor R14 has the same resistance as R10 and R11. The base of transistor Q14 is driven by another op-amp 20 which receives a reference voltage $V_{REF}$ at its noninverting input and has its inverting input connected to the emitter of Q14.

Thus, the voltage across R14 is forced to equal $V_{REF}$, which introduces the scaling for the current generator, and consequently, for the interpolator as described above. The alpha of Q14 replicates that of Q10 and Q11, so $I_{REF}$ is automatically corrected for the alpha of Q11.

Figure 8:
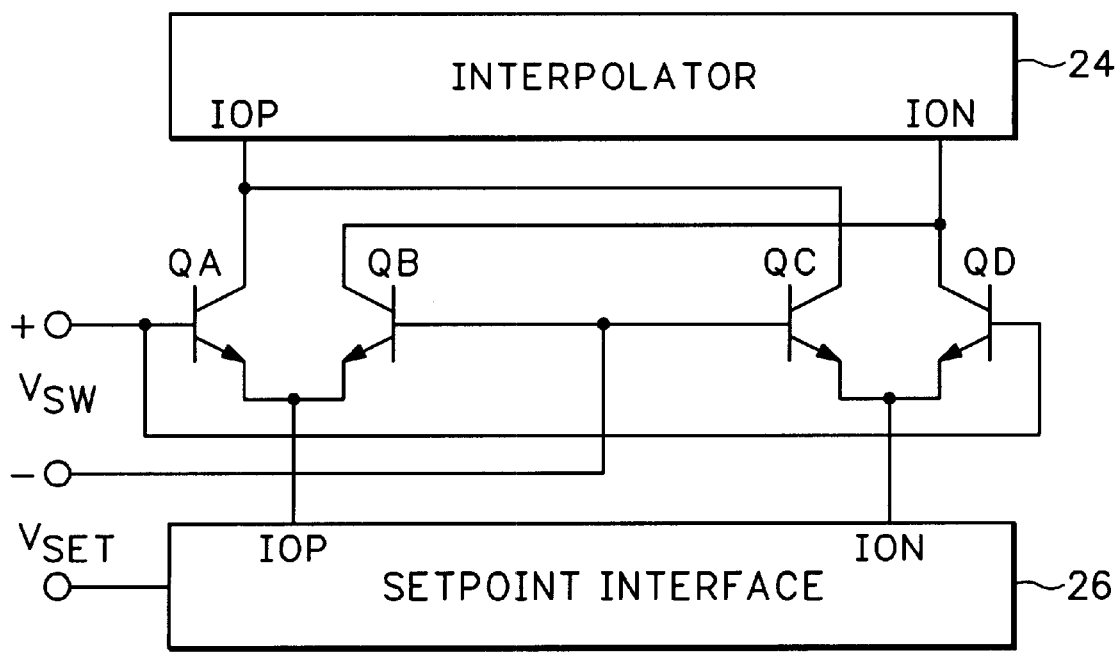
FIG. 8 is a schematic diagram of an embodiment of a change-over switch for use with an interpolator and set-point interface in accordance with the present invention.

In some applications, it is very useful to be able to switch the direction in which the output currents $(1+X)I_X$ and $(1-X)I_X$ change in response to changes in $V_{SET}$. This can be accomplished by using a change-over switch between the interpolator and the setpoint interface. An arrangement for implementing a change-over switch is shown in FIG. 8 in which an interpolator 24 and setpoint interface 26 are shown in simplified form. The change-over switch includes a layer of NPN transistors QA through QD which are driven by a switching control voltage $V_{sw}$ such that the output currents $(1+X)I_X$ and $(1-X)I_X$ are steered to IOP and ION of the interpolator, respectively, when the outer transistors QA and QD are on. When the inner transistors QB and QC are on, the output currents are steered to ION and IOP of the interpolator, respectively. Switching of these currents is essentially complete when $V_{sw}$ is sufficiently large (>180 mV).

The arrangement of transistors QA–QD shown in FIG. 8 is a well-known way of switching the direction of two currents, but it suffers from at least two major problems. First, the layer of transistors take up an excessive amount of power supply voltage. Second, the alpha of the transistors QA–QD reduce the accuracy of the circuit by as much as a few percent.

Figure 9:
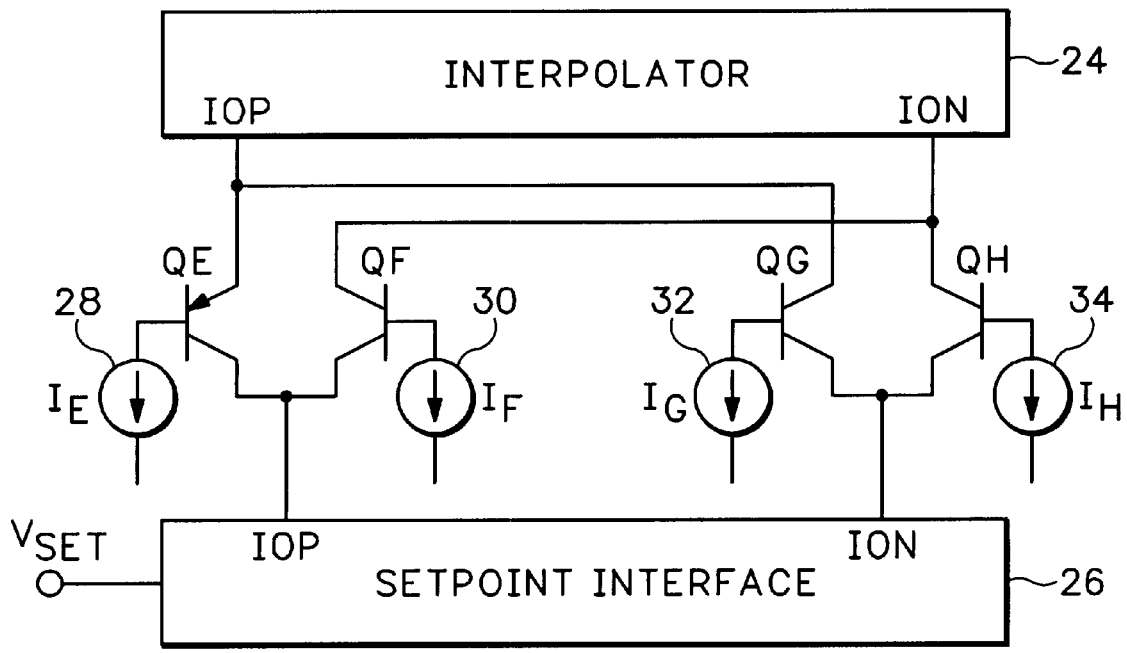
FIG. 9 is a schematic diagram of an embodiment of a change-over switch in accordance with the present invention.

A better technique for switching the direction of the currents from the setpoint interface is illustrated in FIG. 9 which is a schematic diagram of an embodiment of a circuit in accordance with the present invention for switching the direction of the output currents from a setpoint interface. The circuit of FIG. 9 includes a layer of PNP transistors QE, QF, QG, and QH. The emitters of QE and QG are connected to IOP of the interpolator 24, while the emitters of QF and QH are connected to ION of the interpolator. The collectors of QE and QF are connected to IOP of the setpoint interface 26, while the collectors of QG and QH are connected to ION of the setpoint interface. The circuit of FIG. 9 also includes four current sources 28, 30, 32, and 34, each of which is connected to a corresponding one of the bases of QE–QH to provide a base drive current $I_E$, $I_F$, $I_G$, and $I_H$ that can be turned on or off.

The output currents from the setpoint interface are steered by turning on either $I_E$ and $I_H$ or $I_F$ and $I_G$ depending on the desired direction of current flow. By turning $I_E$ and $I_H$ on and $I_F$ and $I_G$ off, the current from the terminals IOP and ION of the set-point interface is steered to the terminals IOP and ION, respectively, of the interpolator. Likewise, by turning $I_F$ and $I_G$ on and $I_E$ and $I_H$ off, the current from the terminals IOP and ION of the set-point interface is steered to the terminals ION and IOP, respectively, of the interpolator. The current sources are designed so that the currents $I_E$, $I_F$, $I_G$, and $I_H$ cause their respective transistors to heavily saturate when turned on, thus, they take up very little of the power supply voltage. A further advantage is that there is no longer any alpha loss because the current flowing through the collector of each transistor flows through its emitter. When the current steering transistors QE–QH are implemented as silicon-on-insulator (SOI) devices, errors caused by the additional currents to the substrate when the devices saturate are eliminated.

Figure 10:
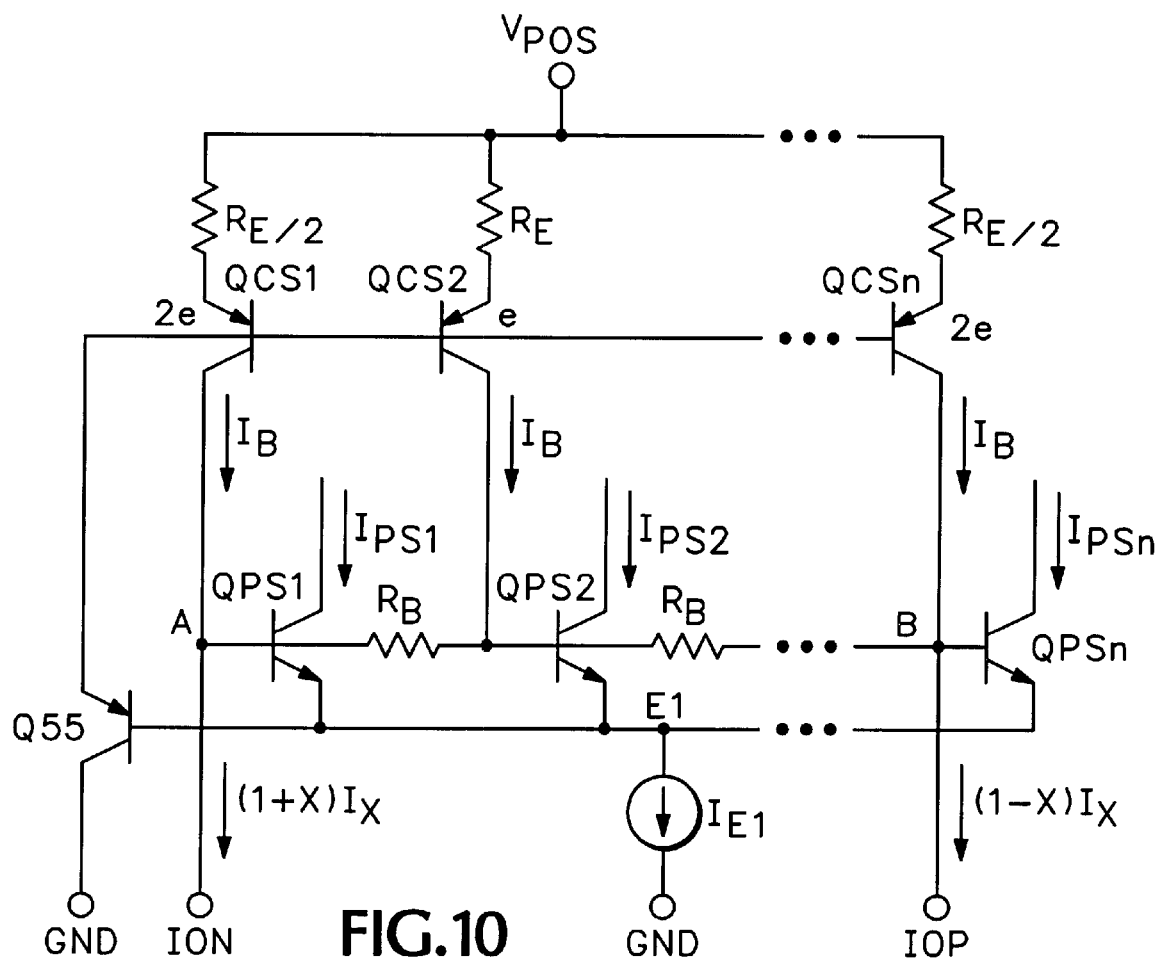
FIG. 10 is a schematic diagram of an embodiment of an interpolator layer in accordance with the present invention adapted for use with the change-over switch circuit of FIG. 9.

A further refinement in accordance with the present invention is illustrated in FIG. 10 which is a schematic diagram of another embodiment of a partially switched interpolator layer constructed in accordance with the present invention. If the change-over switch circuit of FIG. 9 were used directly with the interpolator layer of FIG. 4, the base currents $I_E$, $I_F$, $I_G$, and $I_H$ would introduce an error into the ratiometric currents $(1+X)I_X$ and $(1-X)I_X$. The circuit of FIG. 10 is similar to that of FIG. 4 except that the outer resistors $R_E$ are now replaced by resistors having a resistance of $R_E/2$, and the outer current source transistors QCS1 and QCSn have emitter areas "2e" which are twice as large as those of the other current source transistors which have emitter areas "e". In the circuit of FIG. 4, each resistor $R_E$ carries a current equal to $I_{REF}/n$. Therefore, if the currents $I_E$, $I_F$, $I_G$, and $I_H$ in FIG. 9 are made equal to $I_{REF}/n+2$, the outer current source transistors in the circuit of FIG. 10 can absorb the base currents through QE–QH of FIG. 9 without affecting the operation of the rank of partially switched transistors QPS1–QPSn in FIG. 10. In a preferred embodiment, the current sources 28–34 in FIG. 9 and 22 in FIG. 6 are connected to a common reference circuit so that the currents $I_E$, $I_F$, $I_G$, and $I_H$ have similar characteristics to $I_{REF}$.

Although the embodiments described herein are implemented with bipolar junction transistors (BJT), other devices can be used. The term transistor, as used herein, refers to any device having a control input for controlling the flow of current. Therefore, the term "base" refers to the base of a BJT as well as the gate of a field-effect transistor (FET). Other terms specific to BJT transistors are also understood to refer to the corresponding elements of other types of control devices, e.g., a common emitter node refers to a common source node, a collector corresponds to a drain, etc.

Having described and illustrated the principles of the invention in a preferred embodiment thereof, it should be apparent that the invention can be modified in arrangement and detail without departing from such principles. I claim all modifications and variations coming within the spirit and scope of the following claims.

What is claimed is:

1. An interpolator comprising:
   a first rank of transistors for generating a plurality of partially switched currents responsive to a control signal; and
   a second rank of transistors coupled to the first rank of transistors for spatially amplifying the partially switched currents, thereby generating a plurality of interpolator currents.

2. An interpolator comprising:
   a first rank of transistors for generating a plurality of partially switched currents responsive to a control signal;
   a second rank of transistors coupled to the first rank of transistors for spatially amplifying the partially switched currents, thereby generating a plurality of interpolator currents; and
   a current generator coupled to the first rank of transistors for generating the control signal as a ratiometric signal.

3. An interpolator comprising:
   a first rank of transistors for generating a plurality of partially switched currents responsive to a control signal;
   a second rank of transistors coupled to the first rank of transistors for spatially amplifying the partially switched currents, thereby generating a plurality of interpolator currents; and
   a series of current mirrors coupled between the first and second ranks of transistors.

4. An interpolator comprising:
a first rank of transistors for generating a plurality of partially switched currents responsive to a control signal;
a second rank of transistors coupled to the first rank of transistors for spatially amplifying the partially switched currents, thereby generating a plurality of interpolator currents; and
an amplifier circuit coupled to the first and second ranks of transistors to drive the first rank of transistors, thereby regulating the interpolator currents.

5. An interpolator according to claim 4 wherein the amplifier circuit is adapted to compensate the interpolator currents for temperature variations.

6. An interpolator comprising:
a first rank of transistors for generating a plurality of partially switched currents responsive to a control signal;
a second rank of transistors coupled to the first rank of transistors for spatially amplifying the partially switched currents, thereby generating a plurality of interpolator currents; and
an amplifier circuit coupled to the first and second ranks of transistors to drive the first rank of transistors, thereby regulating the interpolator currents;
wherein the amplifier circuit is adapted to compensate the interpolator currents for the ohmic resistances of a plurality of gm stages which can be coupled to receive the interpolator currents.

7. An interpolator comprising:
a first rank of transistors for generating a plurality of partially switched currents responsive to a control signal;
a second rank of transistors coupled to the first rank of transistors for spatially amplifying the partially switched currents, thereby generating a plurality of interpolator currents; and
an amplifier circuit coupled to the first and second ranks of transistors to drive the first rank of transistors, thereby regulating the interpolator currents;
wherein the amplifier circuit is adapted to compensate the interpolator currents for the gain of the second rank of transistors.

8. An interpolator comprising:
a first rank of transistors for generating a plurality of partially switched currents responsive to a control signal; and
a second rank of transistors coupled to the first rank of transistors for spatially amplifying the partially switched currents, thereby generating a plurality of interpolator currents;
wherein
the first rank of transistors is part of a first interpolator layer;
the emitters of the first rank of transistors are coupled together at a first emitter node; and
the first interpolator layer farther includes:
a plurality of base resistors, wherein the bases of adjacent transistors in the first rank are coupled together through one of the base resistors, and
a plurality of variable current sources, each current source coupled to the base of a corresponding transistor in the first rank.

9. An interpolator according to claim 8 further including a current source coupled to the first emitter node.

10. An interpolator according to claim 9 wherein:
the plurality of variable current sources includes a plurality of current source transistors having their bases coupled together; and
the first interpolator layer further includes a base drive transistor coupled between the bases of the current source transistors and the first emitter node to control the plurality of current source transistors responsive to a drive signal received at the first emitter node.

11. An interpolator according to claim 8 wherein:
the second rank of transistors is part of a second interpolator layer;
the emitters of the second rank of transistors are coupled together at a second emitter node; and
the base of each transistor in the second rank is coupled to the collector of a corresponding transistor in the first rank to receive a corresponding one of the partially switched currents.

12. An interpolator according to claim 11 further including a plurality of current mirrors, wherein the base of each transistor in the second rank is coupled to the collector of a corresponding transistor in the first rank through one of the current mirrors.

13. An interpolator according to claim 11 further including a plurality of emitter follower transistors, wherein the base of each transistor in the second rank is coupled to the collector of a corresponding transistor in the first rank through one of the emitter follower transistors.

14. An interpolator according to claim 11 wherein the second interpolator layer further includes a plurality of resistors, each resistors coupled between the base of one of the transistors in the second rank and the second emitter node.

15. An interpolator according to claim 11 further including a current source coupled to the second emitter node.

16. An interpolator according to claim 8 wherein:
the second rank of transistors is part of a second interpolator layer;
the emitters of the second rank of transistors are coupled together at a second emitter node;
the base of each transistor in the second rank is coupled to the collector of a corresponding transistor in the first rank to receive a corresponding one of the partially switched currents; and
the interpolator further includes an amplifier having a first input terminal coupled to the second rank of transistors to sense the interpolator currents, and an output terminal coupled to the first interpolator layer for controlling the partially switched currents responsive to the interpolator currents, thereby regulating the interpolator currents.

17. An interpolator according to claim 16 wherein the amplifier includes a second input terminal coupled to receive a reference voltage that is proportional to absolute temperature.

18. An interpolator according to claim 17 wherein the reference voltage is corrected so as to compensate for the ohmic resistances of a plurality of gm stages which can be coupled to receive the interpolator currents.

19. An interpolator according to claim 17 wherein the reference voltage is corrected so as to compensate for the gain of the second rank of transistors.

20. An interpolator according to claim 17 wherein the output terminal of the amplifier is coupled to the first emitter node.

21. A method of generating a plurality of interpolator currents comprising:

generating a plurality of partially switched currents responsive to a control signal;

spatially amplifying the partially switched currents, thereby generating the interpolator currents;

sensing the interpolator currents; and controlling the partially switched currents responsive to the interpolator currents, thereby regulating the interpolator currents.

22. A method according to claim 21 further including compensating the interpolator currents for temperature variations.

23. A method according to claim 21 further including compensating the interpolator currents for the ohmic resistances of a plurality of gm stages which receive the interpolator currents.

24. A method of operating a first interpolator layer including: a first rank of transistors having their emitters coupled together at a first emitter node; a plurality of base resistors, wherein the bases of adjacent transistors in the first rank are coupled together through one of the base resistor; and a plurality of current sources, each current source coupled to the base of a corresponding transistor in the first rank; the method comprising:

underdriving the first interpolator layer, thereby generating a plurality of partially switched currents; and spatially amplifying the partially switched currents, thereby generating a plurality of interpolator currents.

25. A method according to claim 24 wherein spatially amplifying the partially switched currents includes coupling a second interpolator layer to the first interpolator layer.

26. An interpolator comprising:

a first rank of transistors for generating a plurality of partially switched currents responsive to a control signal;

a second rank of transistors coupled to the first rank of transistors for spatially amplifying the partially switched currents, thereby generating a plurality of interpolator currents; and a current generator coupled to the first rank of transistors for generating the control signal as a ratiometric signal;

wherein the current generator comprises:

a first transistor for generating a first output current responsive to an input signal;

a second transistor coupled in parallel with the first transistor to generate a replication current responsive to the input signal;

an current source coupled to the second transistor to provide a reference current thereto; and a current mirror coupled to the second transistor for generating a second output current responsive to the replication current.

27. A current generator according to claim 26 further including an op-amp coupled to the first transistor to drive the first transistor responsive to the input signal.

28. A current generator according to claim 26 wherein the first and second transistors have substantially identical alphas.

29. A current generator according to claim 26 wherein the current source includes:

a second current mirror having an output terminal coupled to the second transistor; and a third transistor coupled to an input terminal of the second current mirror for generating the reference current responsive to a reference signal.

30. A current generator according to claim 29 wherein the second current mirror further includes an operational amplifier having a first input terminal coupled to the output terminal of the second current mirror, a second input terminal coupled to the input terminal of the second current mirror; and an output terminal coupled to drive the current mirror so as to match the currents from the input and output terminals of the second current mirror.

31. A current generator according to claim 26 wherein:

the first transistor has an emitter coupled to a first power supply terminal through a first resistor, a base coupled to receive the input signal, and a collector for providing the first output current; and the second transistor has an emitter coupled to the first power supply terminal through a second resistor, a base coupled to the base of the first transistor, and a collector for providing the replication current.

32. A current generator according to claim 31 wherein the current source includes:

a third transistor having a base, an emitter coupled to a second power supply terminal, and a collector coupled to the collector of the second transistor;

a fourth transistor having a base coupled to the base of the third transistor, an emitter coupled to the second power supply terminal, and a collector coupled to receive a reference current.

33. A current generator according to claim 32 wherein the current source further includes an op-amp having a first input terminal coupled to the collector of the third transistor, a second input terminal coupled to the collector of the fourth transistor, and an output terminal coupled to the bases of the third and fourth transistors.

34. A current generator according to claim 33 wherein the current source further includes a second current source coupled to the bases of the third and fourth transistors to provide a pre-bias current thereto.

35. A current generator according to claim 33 wherein the current source further includes a fifth transistor having a collector coupled to the collector of the fourth transistor to provide the reference current thereto, wherein the alpha of the fifth transistor matches the alpha of the second transistor.

36. A current generator according to claim 35 wherein the fifth transistor has a base coupled to receive a reference signal for setting the value of the reference current.

37. A method of generating a plurality of interpolator currents comprising:

generating a plurality of partially switched currents responsive to a control signal;

spatially amplifying the partially switched currents, thereby generating the interpolator currents; and generating the control signal as a ratiometric signal;

wherein generating the control signal comprises:

generating a first output current responsive to an input signal;

replicating the -first output current, thereby generating a replication current;

generating a reference current; and summing the replication current with the reference current, thereby generating a second output current.

38. A method according to claim 37 further including coupling the second output current through a current mirror.

39. A method according to claim 37 wherein:

generating the first output current includes driving a first transistor with the input signal; and replicating the first output current includes replicating the alpha of the first transistor in the replication current.

40. A method according to claim 39 wherein generating the reference current includes replicating the alpha of the first transistor in the reference current.

41. A method according to claim 37 wherein generating the reference current includes generating the reference current responsive to a reference signal, thereby setting the scaling of the first and second output currents.

42. An interpolator according to claim 4 wherein the amplifier circuit comprises a biasing servo-loop.

43. An interpolator according to claim 42 herein the biasing servo loop is constructed and. arranged to sense the total of the interpolator currents and bias the first rank transistors responsive to the total of the interpolator currents.

44. An interpolator comprising:
   a first rank of transistors for generating a plurality of currents responsive to a control signal;
   a second rank of transistors coupled to the first rank of transistors for spatially amplifying the plurality of currents, thereby generating a plurality of interpolator currents; and
   a biasing servo-loop coupled to the first and second ranks of transistors.

45. An interpolator comprising:
   means for generating a plurality of interpolator currents responsive to a control signal;
   means for spatially amplifying the interpolator currents; and
   means for generating the control signal as a ratiometric signal
   wherein the means for regulating the interpolator currents comprises a biasing servo-loop.

46. An interpolator according to claim 1 wherein each of the first and second ranks of transistors each includes three or more transistors.

47. An interpolator according to claim 1 further comprising base line circuitry coupled between the bases of adjacent transistors in the first rank of transistors.

48. An interpolator according to claim 47 wherein the base line circuitry comprises:
   a plurality of resistors coupled between the bases of adjacent transistors; and
   a plurality of current sources coupled to the bases of the transistors.

49. An interpolator comprising:
   a first rank of three or more transistors for generating a plurality of partially switched currents responsive to a control signal;
   base line circuitry coupled between the bases of adjacent transistors in the first rank of transistors, and constructed so as to cause at least three of the first rank of transistors to turn on when the control signal is not at an end of its range; and
   a second rank of three or more transistors coupled to the first rank of transistors for spatially amplifying the partially switched currents.

* * * * *